US006538461B2

(12) United States Patent
Novak et al.

(10) Patent No.: US 6,538,461 B2
(45) Date of Patent: Mar. 25, 2003

(54) SYSTEM AND METHOD FOR TESTING INTEGRATED PASSIVE COMPONENTS IN A PRINTED CIRCUIT BOARD

(75) Inventors: Istvan Novak, Maynard, MA (US); Valerie A. St. Cyr, Lincoln, MA (US)

(73) Assignee: Sun Microsystems, Inc., Santa Clara, CA (US)

(*) Notice: Subject to any disclaimer, the term of this patent is extended or adjusted under 35 U.S.C. 154(b) by 106 days.

(21) Appl. No.: 09/847,164

(22) Filed: May 1, 2001

(65) Prior Publication Data

US 2002/0163327 A1 Nov. 7, 2002

(51) Int. Cl.[7] .............................................. G01R 31/02
(52) U.S. Cl. ........................................ 324/754; 324/761
(58) Field of Search ................................ 324/754, 537, 324/761, 762, 765

(56) References Cited

U.S. PATENT DOCUMENTS

| | | | | |
|---|---|---|---|---|
| 4,611,377 A | * | 9/1986 | McCormick et al. | 29/703 |
| 5,432,460 A | * | 7/1995 | Flecha et al. | 324/754 |
| 5,596,283 A | * | 1/1997 | Mellitz et al. | 324/754 |
| 5,631,572 A | * | 5/1997 | Sheen et al. | 324/754 |
| 6,112,588 A | * | 9/2000 | Cavallaro et al. | 73/149 |
| 6,150,831 A | | 11/2000 | Asai et al. | |
| 6,262,426 B1 | * | 7/2001 | Zafiratos | 250/492.2 |
| 6,452,410 B1 | * | 9/2002 | Parker | 324/762 |

OTHER PUBLICATIONS

Polar Instruments, "RITS500s Robotic Impedance Test System," ©2000, 6 pgs.
HIOKI Company, "1116 X–Y C HiTESTER," Jun. 2000, 4 pgs.
HIOKI Company, "1115 X–Y C HiTESTER," Apr. 1999, 4 pgs.
Li Hai et al., "Electrical Test Techniques for Buried Resistor Board," Electronic Circuits World Convention, 1999, 4 pgs.
* cited by examiner

*Primary Examiner*—Kamand Cuneo
*Assistant Examiner*—Jermele M. Hollington
(74) *Attorney, Agent, or Firm*—Meyertons, Hood, Kivlin, Kowert & Goetzel, P.C.; B. Noël Kivlin

(57) ABSTRACT

The problems outlined above may in large part be solved by a system and method for testing integrated passive components in a printed circuit board. In one embodiment, testing of integrated passive components may be conducted prior to completing the final lamination of the printed circuit board. The testing may be conducted on a tester having movable test probes. The method may include connecting a first test probe to a conductive plane, which may be electrically connected to the first terminals of two or more components. The conductive plane may be a ground plane, a power plane, or a signal plane. The first test probe may remain in a fixed position throughout the testing. A second test probe may be electrically connected to the second terminal of the first component. Following the connection of the second test probe, an electrical characteristic of the first component may be measured. Following the measurement of an electrical characteristic of the first component, the second test probe may then be repositioned in order to be electrically connected to the second terminal of a second component. After repositioning and electrically connecting the second test probe to the second terminal of the second component, an electrical characteristic of the second component may be measured. This may be repeated for any number of components to be tested. The first test probe, which is electrically connected to a conductive plane to which each of the tested components is electrically connected, may remain in a fixed position throughout the testing, while the second test probe moves from component to component.

50 Claims, 8 Drawing Sheets

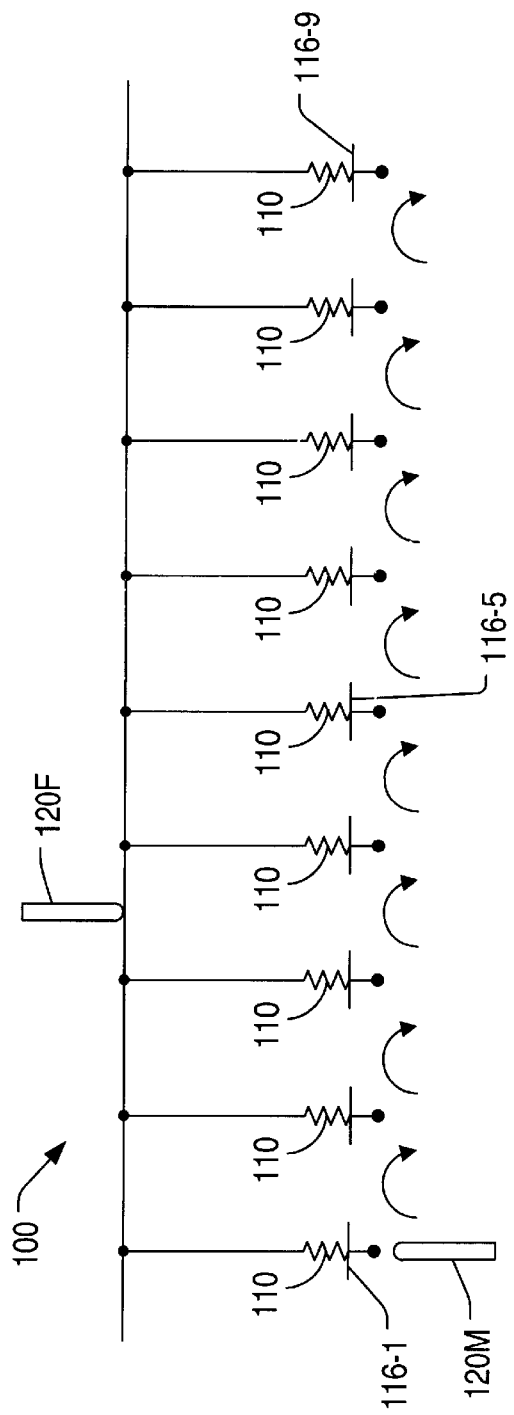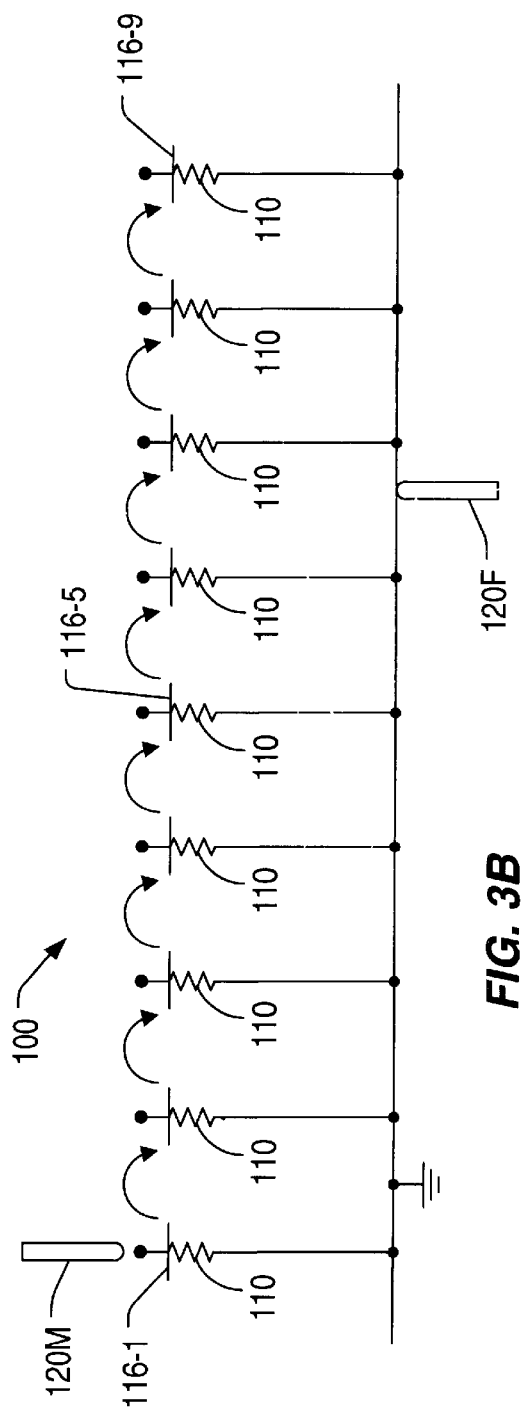

SYSTEM AND METHOD FOR TESTING INTEGRATED PASSIVE COMPONENTS IN A PRINTED CIRCUIT BOARD

BACKGROUND OF THE INVENTION

1. Field of the Invention

This invention relates to printed circuit boards, and more specifically, to the testing of integrated passive components.

2. Description of the Related Art

As advances in computer systems and electronic systems continue, many printed circuit assemblies may be designed to operate at higher frequencies. For example, personal computers having a motherboard with a bus speed exceeding 100 MHz are typical, and this speed will almost certainly increase in the future.

One design consideration that plays a greater role in high-frequency printed circuit assemblies is parasitics. Parasitics may be defined as those electrical characteristics which may be negligible at lower frequencies, but play an increasing role as frequency increases. Parasitic characteristics that must be considered for highfrequency printed circuit assemblies include parasitic capacitances and parasitic inductances. These parasitic electrical characteristics may be affected by many different factors, such as length and width of a circuit trace, pad geometry for surface mounted components, and so on. Parasitics may become a major limitation at high frequencies in the design of printed circuit assemblies.

The use of integrated passive components may help reduce the effects of parasitics. Integrated passive components are components that are integrated directly into or onto a printed circuit board. Resistors, capacitors, and inductors may be implemented in a circuit using integrated passives. Integrated passive components may be assembled into the appropriate layer of a printed circuit board prior to lamination. Following the placement of integrated passives, additional layers of material may be added to the printed circuit board, followed by a lamination process.

In order to ensure that the proper types and values of integrated passive components are integrated into a printed circuit board, testing may be required. Testing may occur either prior to or following lamination of the printed circuit board, or both. Testing of circuit boards with integrated passive components is often accomplished by test systems having movable probes, which may be referred to as "flying probe" testers. Flying probe testers may include several test probes. When testing a two-terminal component, such as a resistor, a flying probe tester may place a probe on each of the nodes to which terminals of the component are electrically connected. Additional probes may be placed at nearby circuit nodes in order to compensate for unwanted shunt currents, thereby enabling a more accurate reading of the component's electrical parameters.

Testing of integrated passive components prior to lamination may present various difficulties. Prior to lamination, the various layers of a printed circuit board may be very flexible and fragile. It may not be possible to establish a good test connection with pads or circuit traces coupled to the integrated passive component under test, as a highpressure test probe contact could damage the inner layers of the printed circuit board. However, if pressure of test probe contact is insufficient, test results may be inaccurate.

Following lamination, test probes may make a high-pressure contact with a printed circuit board with minimal risk of damage. However, it may not be possible to conduct repairs to the printed circuit board following lamination. Thus if an integrated passive component is damaged or has a value that is not within specification, the printed circuit board may have to be scrapped.

SUMMARY OF THE INVENTION

The problems outlined above may in large part be solved by a system and method for testing integrated passive components in a printed circuit board. In one embodiment, testing of integrated passive components may be conducted prior to completing the final lamination of the printed circuit board. The testing may be conducted on a tester having movable test probes. The method may include connecting a first test probe to a conductive plane, which may be electrically connected to the first terminals of two or more components. The conductive plane may be a ground plane, a power plane, or a signal plane. The first test probe may remain in a fixed position throughout the testing. A second test probe may be electrically connected to the second terminal of the first component. Following the connection of the second test probe, an electrical characteristic of the first component may be measured. Following the measurement of an electrical characteristic of the first component, the second test probe may then be repositioned in order to be electrically connected to the second terminal of a second component. After repositioning and electrically connecting the second test probe to the second terminal of the second component, an electrical characteristic of the second component may be measured. This may be repeated for any number of components to be tested. The first test probe, which is electrically connected to a conductive plane to which each of the tested components is electrically connected, may remain in a fixed position throughout the testing, while the second test probe moves from component to component.

In another embodiment, testing of integrated passive components may be conducted subsequent to completing the final lamination of the printed circuit board. The testing may include electrically connecting a first test probe to a first conductive plane, such as a power plane, and a second test probe to a second conductive plane, such as a ground plane. A first terminal of each of a plurality of components may be electrically connected to either the first or second conductive planes. A second terminal of each of the plurality of components may be connected to a signal path, which may be electrically isolated from the signal paths to which the other components are electrically connected. A test head having a shorting probe may be used to electrically couple the signal path of a first component under test to either the first plane or the second plane. By shorting the signal path to one of the planes, a current path is created from the first plane, through the first component under test, to the second plane. This may allow for the measurement of an electrical characteristic of the first component under test. Following the measurement of an electrical characteristic for the first component, the test head having a shorting probe may be moved in order to electrically couple the signal path of a second component under test to either the first plane or second plane. This may allow for the measurement of an electrical characteristic of the second component under test. This may be repeated for any number or components under test. The first test probe and second test probe may remain in a fixed position during the test, while the test head moves the shorting probe in order to create the necessary current path for the component under test.

The testing of the integrated passive components may be performed on a test system having movable probes and/or test heads. The test system may include at least a first probe and a second probe, each of which are capable of being repositioned in order to be electrically connected to various locations on the printed circuit board. The test system may further include a movable test head to which a shorting probe may be attached. Software in the test system may cause the tester to perform the testing for integrated passive components, as described above, prior to or following the final lamination of the printed circuit board.

Electrical characteristics that may be measured include, but are not limited to, resistance, capacitance, and inductance. The types of components for which measurements may be performed may include, but are not limited to, resistors, inductors, and capacitors. Other embodiments are possible and contemplated wherein the measurement of secondary electrical characteristics may be performed. Such secondary electrical characteristics may include the equivalent series resistance of a capacitor or the impedance of an inductor.

BRIEF DESCRIPTION OF THE DRAWINGS

Other objects and advantages of the invention will become apparent upon reading the following detailed description and upon reference to the accompanying drawings in which:

FIG. 3A is a schematic diagram illustrating the testing of a plurality of integrated passive components, for one embodiment of a printed circuit board, prior to lamination;

FIG. 3B is a is a schematic diagram illustrating the testing of a plurality of integrated passive components for another embodiment of a printed circuit board, prior to lamination;

Figure 1:
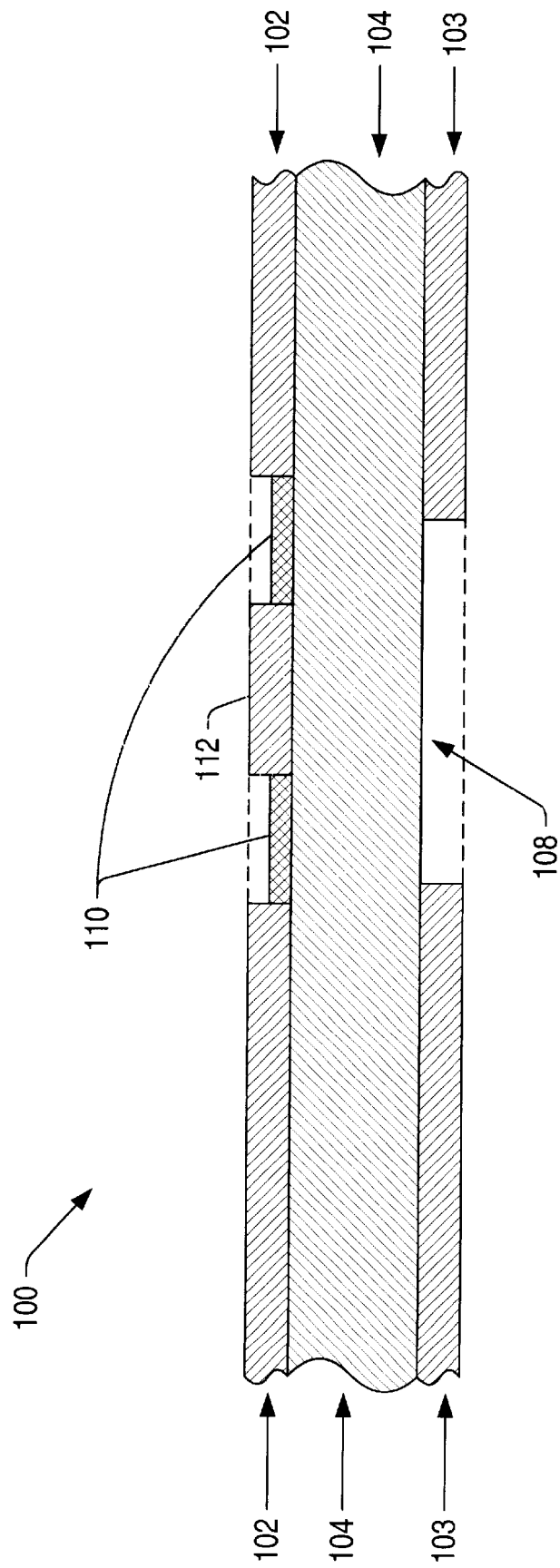
FIG. 1 is a cross-sectional view of one embodiment of a printed circuit board, prior to lamination, having integrated passive components.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Turning now to FIG. 1, a cross-sectional view of one embodiment of a printed circuit board, prior to final lamination, having integrated passive components is shown. Printed circuit board 100, shown here prior to final lamination, includes a power plane 102 and a ground plane 103 separated by a dielectric layer 104. Printed circuit board 100 also includes integrated passive components 110, each of which are electrically connected to power plane 102 in this example. In other embodiments, integrated passive components 110 may be electrically connected to a ground plane 103, or other type of power or reference plane. Integrated passive components 110 may be one of several different types of components, including resistors, capacitors, or inductors. Printed circuit board 100 may also include anti-pad 108, which is an aperture in ground plane 103. Anti-pads 108 may be useful in creating signal vias in the printed circuit board prior to lamination. Similar anti-pads may be formed by creating apertures in power plane 102, or any other plane which may be present in a particular embodiment of a printed circuit board.

Power plane 102 and ground plane 103 may be made of a conductive material (e.g. copper). Power plane 102 and ground plane 103 may each be one of several power and ground planes that may be added to printed circuit board 100 prior to lamination. In one embodiment, power plane 102 and ground plane 103 have length and width dimensions comparable with the length and width dimensions of printed circuit board 100. Power plane 102 and ground plane 103 may each include one or more apertures which may allow for vias that connect circuit elements on the surface of printed circuit board with internal layers. Conductive signal planes may also be added to printed circuit board 100.

Each of integrated passive components 110 may also be electrically connected to signal pad 112, as shown in this example. Signal pad 112 may be part of a signal path which may electrically connect integrated passive components 110 to another component in the electronic circuit in which printed circuit board 100 may be used. In this particular example, the two integrated passive components 110 are in an electrically parallel configuration. In other embodiments, integrated passive components 110 may be implemented in a different electrical configuration.

Figure 2:
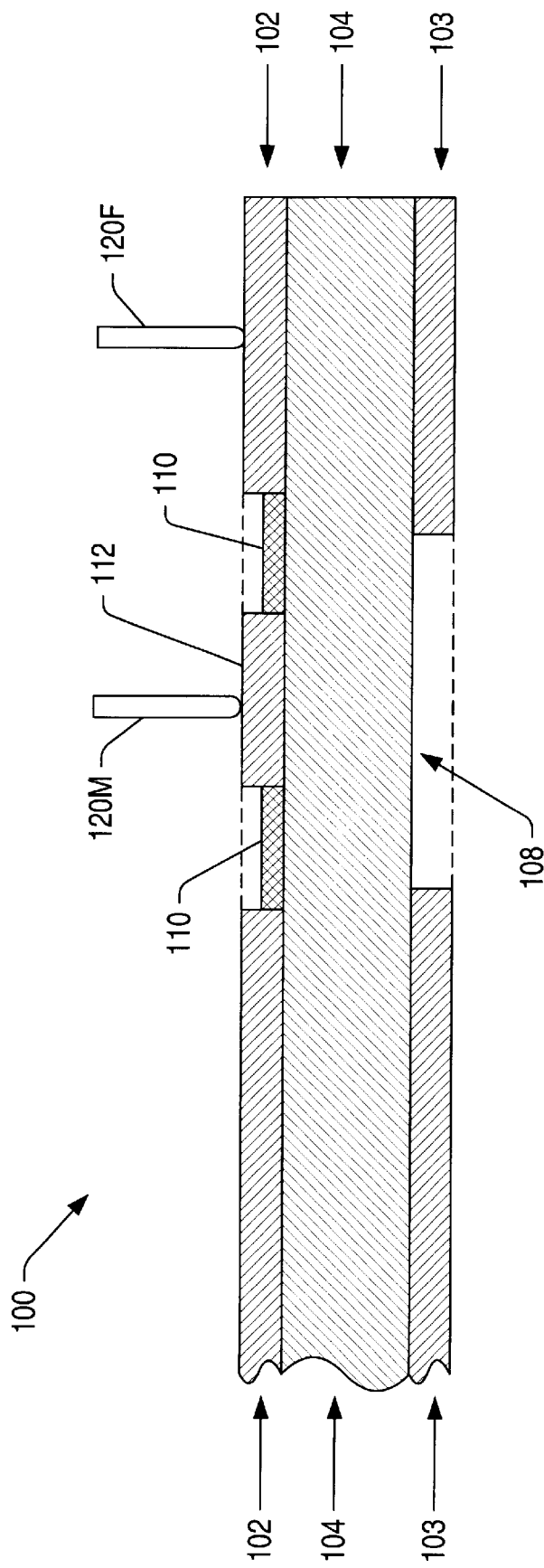
FIG. 2 is a cross-sectional view of the printed circuit board of FIG. 1 having test probes connected for the purposes of testing integrated passive components.

Moving now to FIG. 2, a cross-sectional view of printed circuit board 100 having test probes 120F and 120M connected for the purposes of testing integrated passive components 110 is shown. In the embodiment shown, test probe 120F is electrically connected to power plane 102. Test probe 120F may remain connected to power plane 102 until all integrated passive components 110 having a terminal connected to power plane 102 have been tested. Test probe 120F may be able to achieve a robust electrical connection to power plane 102, which may allow for more accurate test results. Test probe 120M may be electrically connected to signal pad 112 in order to test integrated passive components 110. After completing the testing of the integrated passive components 110 shown in this drawing, test probe 120M may be moved to another signal pad 112 (not shown) to test further instances of integrated passive components 110. This method may be repeated for all integrated passive components that are electrically coupled to power plane 103. During the testing of integrated passive components 110, test probe 120F may remain in a fixed position until all integrated passive components connected to power plane 103 have been tested, while test probe 120M may move to different signal pads in order to test each integrated passive component 110 individually. Furthermore, the method may be performed for integrated passive components which are electrically connected to ground plane 103, and may further be performed for components which are electrically connected to any other power, ground, signal, or reference planes that may be present in printed circuit board 100.

FIGS. 3A and 3B further illustrate the method of testing described above in reference to FIG. 2. A portion of printed circuit board 100 is illustrated in schematic form in FIG. 3A. In the embodiment shown, printed circuit board 100 includes a plurality of integrated passive components 110, which are resistors in this example. A first terminal of each resistor is electrically connected to power plane 102. A second terminal of each resistor is electrically connected to a test point on a signal path 116. Each of the signal paths are electrically isolated from the other signal paths, hence the designations here of signal paths 116-1 to 116-9.

A first test probe 120F may be connected to power plane 102, as shown in this example. Test probe 120F may remain fixed in the same position until each of the resistors (or other integrated passive components) has been tested. Test probe 120M may be a moving test probe. Test probe 120M may begin the testing by being positioned in contact with the test point which is electrically connected to signal path 116-1. After connecting test probe 120M to the test point, an electrical characteristic of the resistor (e.g. a resistance value) between power plane 102 and signal path 116-1 may be measured. Following the measurement of the first resistor 110, test probe 120M may be repositioned to be connected to a test point that is electrically connected to the second resistor. This may be repeated for each resistor to be tested.

A similar configuration for testing integrated passive components is shown in FIG. 3B. As in FIG. 3A, the components to be tested are resistors, wherein a first terminal of each resistor is connected to a conductive plane, which is ground plane 103 in this example. Test probe 120F may be connected to ground plane 103, and may remain fixed in the same position until the testing of all integrated passive components connected to the ground plane have been tested. Test probe 120M may be connected to a first test point electrically connected to signal path 116-1 in order to test the first resistor, and may be subsequently repositioned to test points which are electrically connected to other signal paths in order to test the other resistors.

While the examples of FIGS. 3A and 3B involve the testing of resistors, other types of integrated passive components may be tested as well. For example, a capacitance value may be measured for an integrated capacitor, or an inductance value may be measured for an integrated inductor. Furthermore, other embodiments are possible and contemplated wherein a secondary electrical characteristic of an integrated passive component is measured. For example, one embodiment may include the measuring of the equivalent series resistance (ESR) of a capacitor, or an impedance value for an integrated inductor or capacitor at a given frequency.

Figure 4A:
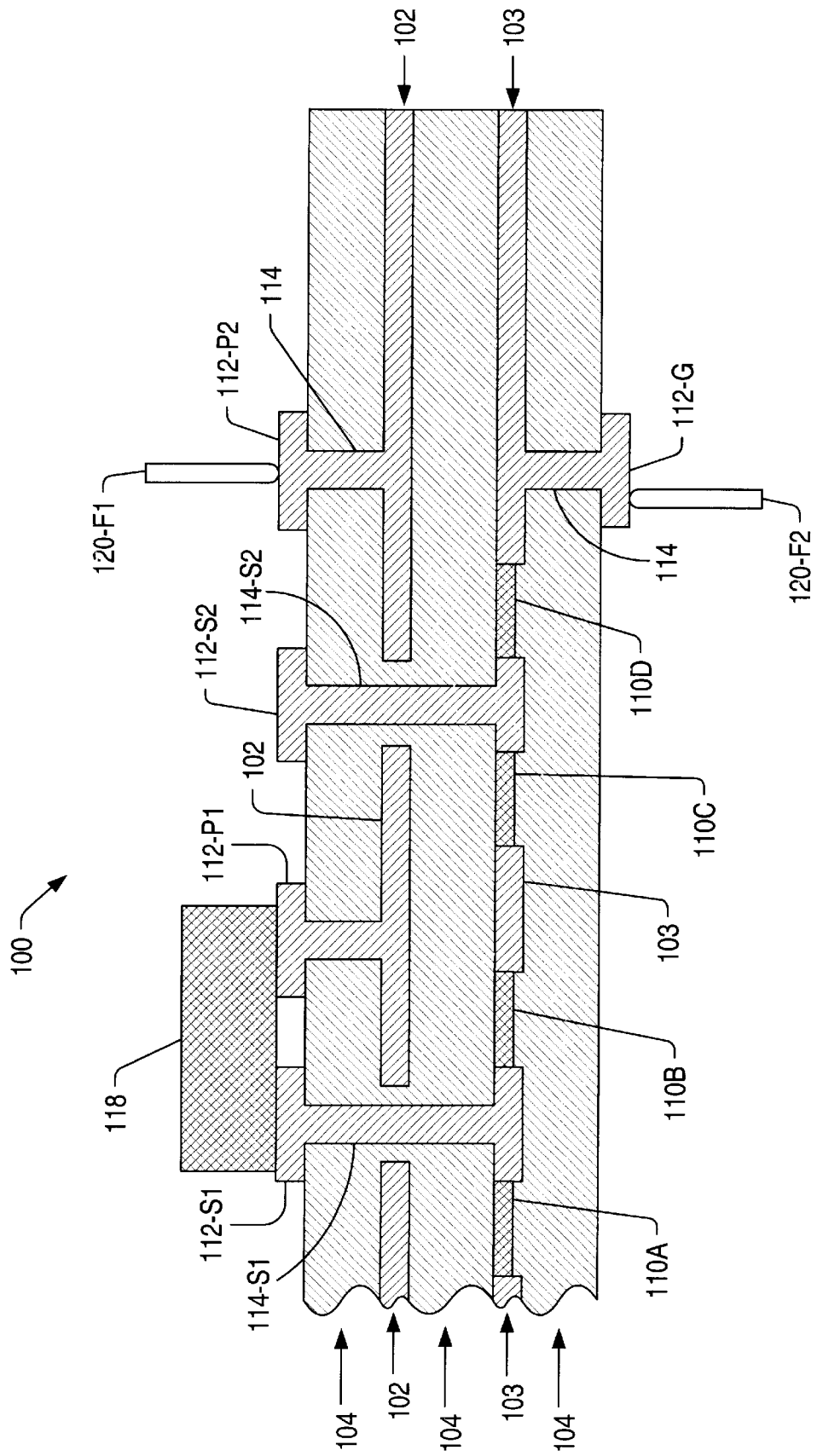
FIG. 4A is a cross-sectional view of one embodiment of a printed circuit board, following lamination, illustrating the connection of test probes and a shorting probe for the purposes of testing integrated passive components.

Moving now to FIG. 4A, a cross-sectional view of one embodiment of a printed circuit board, following final lamination, illustrating the connection of test probes and a shorting probe for the purposes of testing integrated passive components is shown. In the embodiment shown, printed circuit board 100 has been through the final lamination process, and includes the four integrated passive components 110A–100D shown. In this example, a first terminal of each of integrated passive components 110 is connected to ground plane 103. Integrated passive components 110A and 110B each have a second terminal electrically connected to a signal via 114-S1. Signal via 114-S1 is connected to signal pad 112-S1, which is located on the surface of printed circuit board 100. Printed circuit board 100 also includes a power plane 102, which is electrically connected to surface pads 112-P1 and 112-P2. Dielectric 104 may separate power plane 102 from ground plane 103, and may further separate each of these planes from the surface of the board and any vias 114.

In the embodiment shown, a first test probe 120-F1 may be electrically connected to surface pad 112-P2, which is connected through a via 114 to power plane 102. A second test probe 112-F2 may be electrically connected to surface pad 112-G, which is connected through a via 114 to ground plane 103. Surface pad 112-S1 may be electrically connected to surface pad 112-P1, by shorting probe 118, thereby creating a current path from test probe 120-F1, through power plane 102, though integrated passive components 110A and 110B, to ground plane 103 and to test probe 120-F2. A test system to which the test probes are coupled may measure an electrical characteristic of integrated passive components 110A and 110B (which are in parallel, for this example).

Figure 4B:
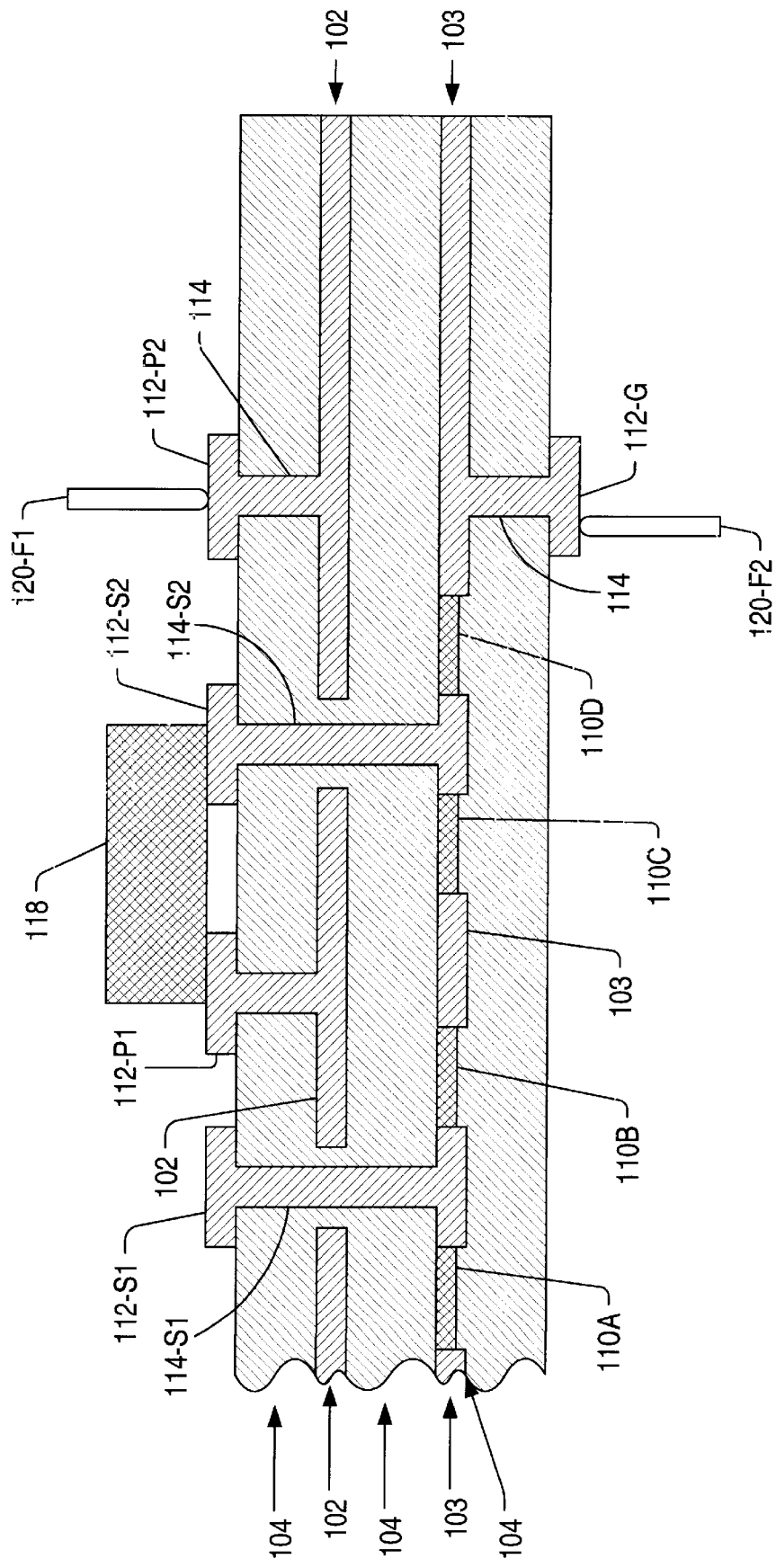
FIG. 4B is a cross-sectional view of the printed circuit board of FIG. 4A, following lamination, further illustrating the connection of test probes and a shorting probe for the purposes of testing integrated passive components.

FIG. 4B is a cross-sectional view of the printed circuit board of FIG. 4A, following final lamination, further illustrating the connection of test probes and a shorting probe for the purposes of testing integrated passive components. In FIG. 4B, a test head to which shorting probe 118 may be attached has been repositioned, thereby moving shorting probe 118 in order to electrically connect surface pad 112-S2 to surface pad 112-P1. This may create a current path between power plane 102 and ground plane 103, which passes through surface pad 112-S2 and via 114-S2 and integrated passive components 110C and 110D. This may allow a test system for test probes 120-F1 and 120-F2 to measure an electrical characteristic of integrated passive components 110C and 110D. Shorting probe 118 may be moved to additional locations in order to test additional integrated passive components (not shown). Test probes 120-F1 and 120-F2 may remain in a fixed location until all testing has been completed.

Figure 5A:
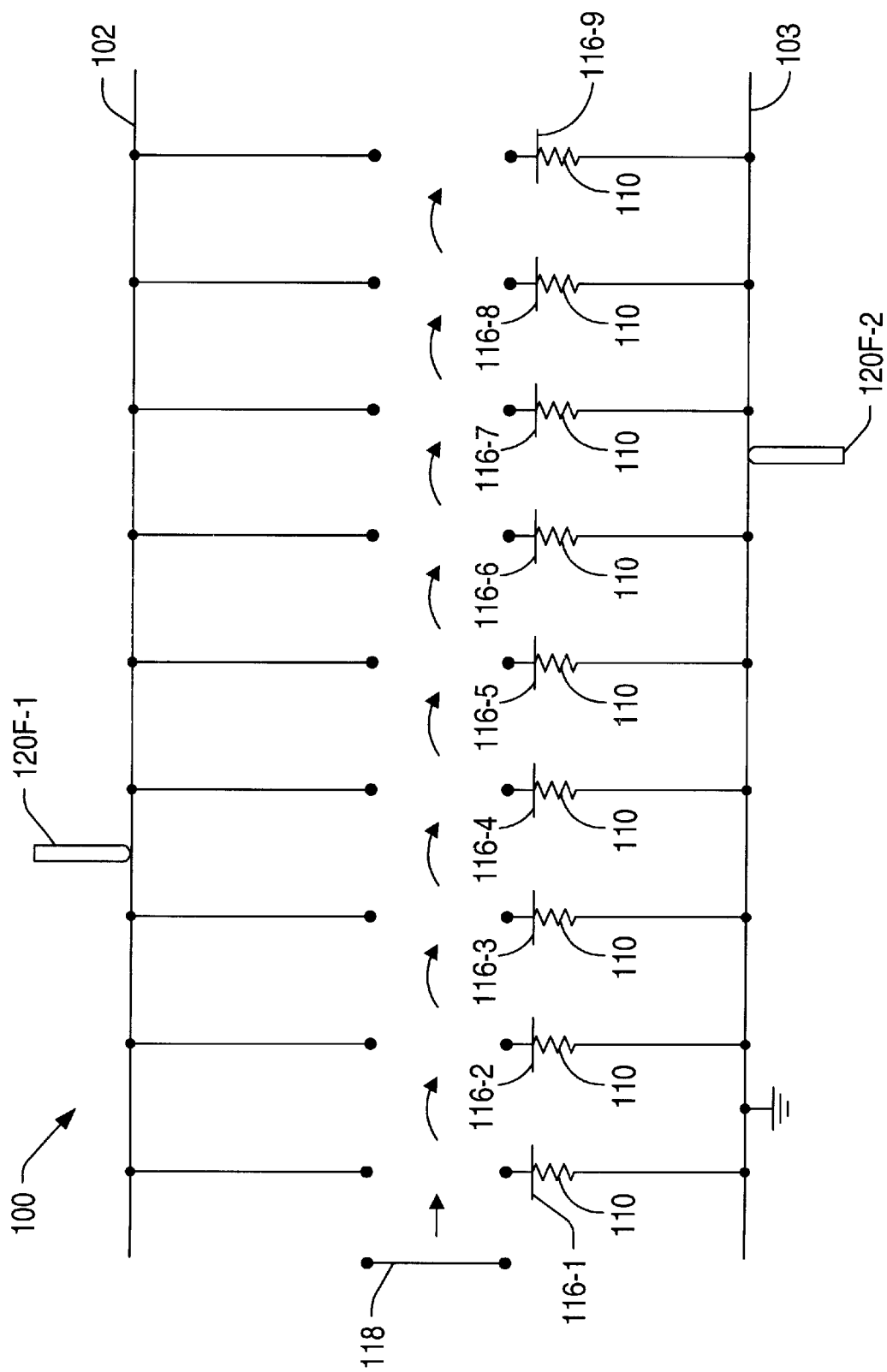
FIG. 5A is a schematic diagram illustrating the testing of a plurality of integrated passive components for one embodiment of a printed circuit board, subsequent to lamination.
Figure 5B:
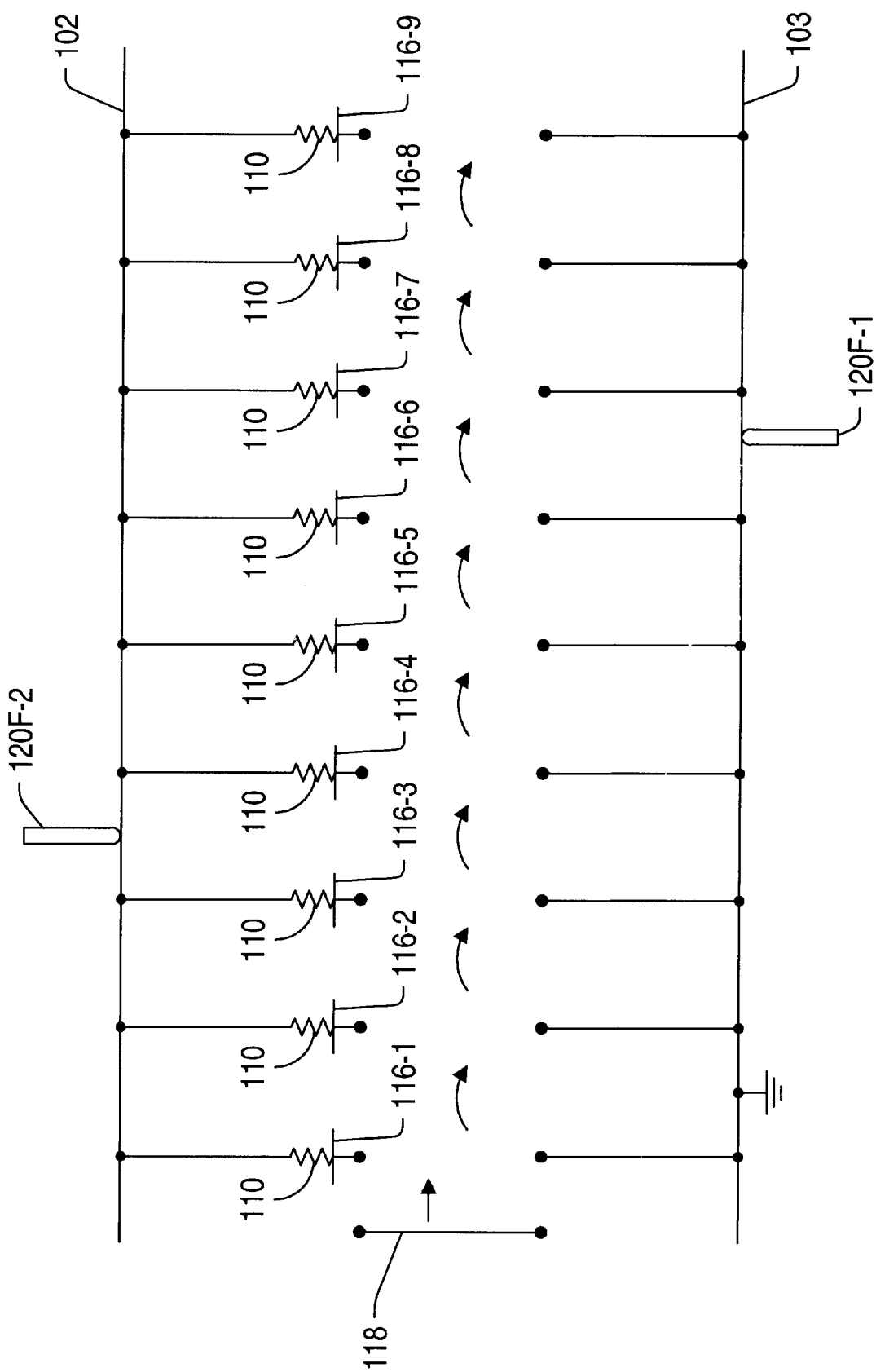
FIG. 5B is a schematic diagram illustrating the testing of a plurality of integrated passive components for another embodiment of a printed circuit board, subsequent to lamination.

FIGS. 5A and 5B are schematic diagrams which will be further used to illustrate the method described in FIGS. 4A and 4B. FIG. 5A is a schematic diagram illustrating the testing of a plurality of integrated passive components 110 for one embodiment of a printed circuit board 100, subsequent to lamination. The portion of printed circuit board 100 represented in the drawing includes a plurality of integrated passive components 110 (resistors in this example), each of which has a first terminal electrically connected to ground plane 103. A second terminal of each resistor is electrically connected to a signal path 116. A first test probe 120-F1 is shown being electrically connected to power plane 102, while a second test probe 120-F2 is shown as being electrically connected to ground plane 103. Shorting probe 118 may be positioned to electrically connect signal path 116-1 to power plane 102 in order to test the first resistor. When the connection is made, a current path may exist between test probe 120-F1 to test probe 120-F2. This current path may pass through power plane 102, shorting probe 118, signal path 116-1, integrated passive component 110, and ground plane 103. An electrical characteristic of the first integrated passive component 110 may be measured using this current path. Following the measurement of the first resistor, shorting probe 118 may be repositioned in order to electrically connect signal path 116-2 to power plane 102. This may create a current path between test probes 120-F1 and 120-F2 through the second resistor, allowing for the measurement of an electrical characteristic of the resistor. The repositioning of shorting probe 118 and the creation of a necessary current path for conducting electrical measurements may be repeated for each of the integrated passive components 110 present. Test probes 120-F1 and 120-F2 may remain in a fixed location until all integrated passive components 110 have been tested.

FIG. 5B is a schematic diagram illustrating the testing of a plurality of integrated passive components for another embodiment of printed circuit board 100 subsequent to lamination. The embodiment shown of printed circuit board 100, and the method of testing therefor, is essentially the same as that shown in FIG. 5A, with the exception that a first terminal of each of integrated passive components 110 is electrically connected to power plane 102. A first test probe 120-F1 is connected to ground plane 103, while a second test probe 120-F2 is connected to power plane 102. The method for testing may be performed by moving only shorting probe 118, leaving test probes 120-F1 and 120-F2 in a fixed location throughout the test. It should also be noted that some embodiments of printed circuit board 100 may include both electrical configurations shown in FIGS. 5A and 5B. In such embodiments, testing may still be possible wherein both test probes 120-F1 and 120-F2 remain fixed in one location throughout the testing, moving only shorting probe 118.

Figure 6:
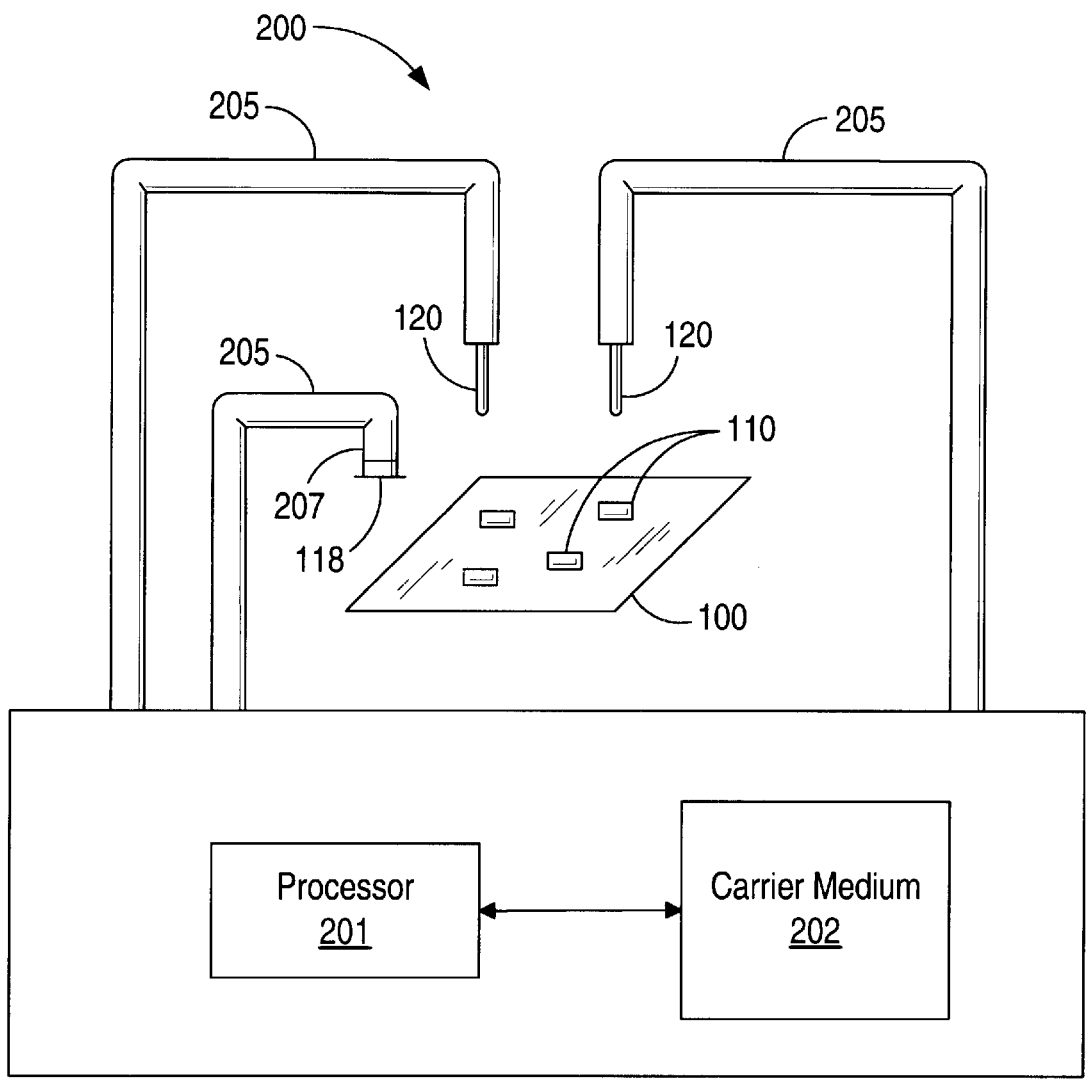
FIG. 6 is an illustration of one embodiment of a test system for testing integrated passive components.

Turning now to FIG. 6, an illustration of one embodiment of a test system for testing integrated passive components. Test system 200 may be configured for testing printed circuit board 100, wherein printed circuit board 100 includes a plurality of integrated passive components 110. In order to test printed circuit board 100, the test system may need to connect test probes 120 to various test points on the board. Test points 120 may be positioned for connecting to test points by their respective movable arms 205. An additional movable arm 205 having a test head 207, to which shorting probe 118 may be coupled, may be included in some embodiments of the test system, which may allow for testing such as that described in FIGS. 4A–4B and 5A–5B. Test system 200 may include additional test probes (and associated movable arms) which may be used to compensate for unwanted shunt currents during the testing of a given component.

Test system 200 may include a processor 201 and a carrier medium 202. Carrier medium 202 may be a memory device, such as a dynamic random access memory (DRAM), a static random access memory (SRAM), read only memory (ROM), compact disk ROM (CD-ROM), flash memory, hard disk storage, floppy disk storage, digital versatile disk (DVD), or other type of media. In one embodiment, carrier medium 202 may be configured to store instructions that, when executed by processor 201, may cause one of the various test methods described above in reference to FIGS. 3A through 5B to be performed. This may include moving of movable arms 205 in order to position test probes 120. The instructions stored in carrier medium 202 may include positioning data, such as x-y coordinates, for positioning the test probes. Some embodiments of the carrier medium may also include data for the positioning of the shorting probe 118 if its use is required. In addition to storing instructions that invoke a particular method of testing, carrier medium 202 may also store results of tests in progress or tests that have been completed. It is further noted that instructions may be rewritten and stored in carrier medium 202 for different embodiments of printed circuit board 100. Carrier medium 202 may alternatively store separate sets of instructions for each embodiment of printed circuit board 100 for which integrated passive components are to be tested.

Test system 200 may also include various instruments for performing measurements of the various electrical characteristics of components under tests. Such instruments may include, but are not limited to, voltmeters, ammeters, ohmmeters, oscilloscopes, signal generators, and so forth. The instruments may be digital or analog instruments. In some embodiments, computer-based instrumentation may be implemented instead of, or in addition to, other instruments present in the test system.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system for testing integrated passive components in a printed circuit board, the system comprising:
   two or more movable test probes;
   a processor,
   a carrier medium configured to store instructions that, when executed by the processor, cause the system to:
      position a first test probe to electrically connect said first test probe to a first conductive plane of a printed circuit board, wherein said first conductive plane is electrically connected to a first terminal of a first component and a first terminal of a second component;
      position a second test probe to electrically connect said second test probe to a second terminal of said first component, wherein said second terminal of said first component is electrically isolated from a second terminal of said second component;
      measure an electrical characteristic of said first component;
      reposition said second test probe to electrically connect said second test probe to said second terminal of said second component; and
      measure an electrical characteristic of said second component.

2. The system as recited in claim 1, wherein said printed circuit board includes said first conductive plane and a second conductive plane, wherein said first conductive plane and said second conductive plane are separated by a dielectric layer.

3. The system as recited in claim 2, wherein additional dielectric layers are laminated to said first conductive plane and said second conductive plane subsequent to said testing integrated passive components.

4. The system as recited in claim 2, wherein the first conductive plane is a power plane.

5. The system as recited in claim 2, wherein the first conductive plane is a ground plane.

6. The system as recited in claim 1, wherein said instructions, when executed by the processor, further cause the system to position the second test probe to electrically connect the second test probe to a second terminal of a third component, wherein the second terminal of the third component is electrically isolated from the second terminal of the first component and the second terminal of the second component, and wherein a first terminal of said third component is electrically connected to the first conductive plane.

7. The system as recited in claim 6, wherein the system is further configured to measure an electrical characteristic of the third component.

8. The system as recited in claim 7, wherein the first component, the second component, and the third component are resistors.

9. The system as recited in claim 8, wherein the electrical characteristic of the first component, the second component, and the third component is a resistance value.

10. The system as recited in claim 6, wherein the first component, the second component, and the third component are capacitors.

11. The system as recited in claim 10, wherein the electrical characteristic of the first component, the second component, and the third component is a capacitance value.

12. The system as recited in claim 6, wherein the first component, the second component, and the third component are inductors.

13. The system as recited in claim 12, wherein the electrical characteristic of the first component, the second component, and the third component is an inductance value.

14. A method for testing integrated passive components in a printed circuit board, the method comprising:
an automated test system electrically connecting a first test probe to a first conductive plane, wherein the first conductive plane is electrically connected to a first terminal of a first component and a first terminal of a second component;
the automated test system electrically connecting a second test probe to a second terminal of the first component, wherein the second terminal of said first component is electrically isolated from a second terminal of the second component;
measuring an electrical characteristic of said first component;
the automated test system repositioning the second test probe and electrically connecting the second test probe to the second terminal of the second component; and
measuring an electrical characteristic of the second component.

15. The method as recited in claim 14, wherein said printed circuit board includes said first conductive plane and a second conductive plane, wherein said first conductive plane and said second conductive plane are separated by a dielectric layer.

16. The method as recited in claim 15, wherein additional dielectric layers are laminated to said first conductive plane and said second conductive plane subsequent to said testing integrated passive components.

17. The method as recited in claim 15, wherein the first conductive plane is a power plane.

18. The method as recited in claim 15, wherein the first conductive plane is a ground plane.

19. The method as recited in claim 14 further comprising the automated test system repositioning the second test probe and electrically connecting the second test probe to a second terminal of a third component, wherein the second terminal of the third component is electrically isolated from the second terminal of the first component and the second terminal of the second component, and wherein a first terminal of the third component is electrically connected to the first conductive plane.

20. The method as recited in claim 19, wherein the system is further configured to measure an electrical characteristic of the third component.

21. The method as recited in claim 20, wherein the first component, the second component, and the third component are resistors.

22. The method as recited in claim 21, wherein the electrical characteristic of the first component, said second component, and said third component is a resistance value.

23. The method as recited in claim 20, wherein the first component, the second component, and the third component are capacitors.

24. The method as recited in claim 23, wherein the electrical characteristic of the first component, the second component, and the third component is a capacitance value.

25. The method as recited in claim 20, wherein the first component, the second component, and the third component are inductors.

26. The method as recited in claim 25, wherein the electrical characteristic of the first component, the second component, and the third component is an inductance value.

27. A system for testing integrated passive components in a printed circuit board, the system comprising:
two or more movable test probes;
a movable test head having a shorting probe;
a processor,
a carrier medium configured to store instructions that, when executed by the processor, cause the system to:
electrically connect a first test probe to a first conductive plane and a second test probe to a second conductive plane;
electrically connect a first signal path to the first plane using the shorting probe;
measure an electrical characteristic of a first component, wherein a first terminal of the first component is electrically connected to the second conductive plane and a second terminal of the first component is electrically connected to said signal path,
electrically connect a second signal path to the first conductive plane using the shorting probe; and
measure an electrical characteristic of a second component, wherein a first terminal of the second component is electrically connected to the second conductive plane and a second terminal of the second component is electrically connected to the second signal path.

28. The system as recited in claim 27, wherein the testing of integrated passive components is conducted subsequent to final lamination of the printed circuit board.

29. The system as recited in claim 27, wherein the first conductive plane is a power plane.

30. The system as recited in claim 27, wherein the first conductive plane is a ground plane.

31. The system as recited in claim 27, wherein said instructions, when executed by the processor, further cause the system to electrically connect a third signal path to said first conductive plane using the shorting probe, and measure an electrical characteristic of a third component, wherein a first terminal of the third component is connected to the second conductive plane and a second terminal of the third component is connected to the third signal path.

32. The system as recited in claim 31, wherein the first component, the second component, and the third component are resistors.

33. The system as recited in claim 32, wherein the electrical characteristic of the first component, the second component, and the third component is a resistance value.

34. The system as recited in claim 31, wherein the first component, the second component, and the third component are capacitors.

35. The system as recited in claim 34, wherein the electrical characteristic value of the first component, the second component, and the third component is a capacitance value.

36. The system as recited in claim 31, wherein the first component, the second component, and the third component are inductors.

37. The system as recited in claim 36, wherein the electrical characteristic of the first component, the second component, and the third component is an inductance value.

38. A method for testing integrated passive components in a printed circuit board, the method comprising:

electrically connecting a first test probe to a first conductive plane and a second test probe to a second conductive plane;

electrically connecting a first signal path to the first conductive plane, measuring an electrical characteristic of a first component, wherein a first terminal of the first component is electrically connected to the second conductive plane and a second terminal of the first component is electrically connected to said first signal path, electrically connecting a second signal path to the first conductive plane; and measuring an electrical characteristic of a second component, wherein a first terminal of the second component is electrically connected to the second conductive plane and a second terminal of the second component is electrically connected to the second signal path.

39. The method as recited in claim 38, wherein the testing of integrated passive components is conducted subsequent to final lamination of said printed circuit board.

40. The method as recited in claim 38, wherein the first conductive plane is a power plane.

41. The method as recited in claim 38, wherein the first conductive plane is a ground plane.

42. The method as recited in claim 38, wherein the testing of integrated passive components is performed by an automated test system.

43. The method as recited in claim 42 further comprising using a shorting probe for said electrically connecting the first signal path to the first conductive plane and said electrically connecting the second signal path to the first conductive plane.

44. The method as recited in claim 38 further comprising electrically connecting a third signal path to the first conductive plane and measuring an electrical characteristic of a third component, wherein a first terminal of the third component is connected to the second conductive plane and a second terminal of the third component is connected to the third signal path.

45. The method as recited in claim 44, wherein the first component, the second component, and the third component are resistors.

46. The method as recited in claim 45, wherein the electrical characteristic of the first component, the second component, and the third component is a resistance value.

47. The method as recited in claim 44, wherein the first component, the second component, and the third component are capacitors.

48. The method as recited in claim 47, wherein the electrical characteristic of the first component, the second component, and the third component is a capacitance value.

49. The method as recited in claim 44, wherein the first component, the second component, and the third component are inductors.

50. The method as recited in claim 49, wherein the electrical characteristic of the first component, the second component, and the third component is an inductance value.

* * * * *